United States Patent
Hijikata

(10) Patent No.: US 7,203,104 B2
(45) Date of Patent: Apr. 10, 2007

(54) VOLTAGE DETECTION CIRCUIT CONTROL DEVICE, MEMORY CONTROL DEVICE WITH THE SAME, AND MEMORY CARD WITH THE SAME

(75) Inventor: Keijiro Hijikata, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/481,819

(22) Filed: Jul. 7, 2006

(65) Prior Publication Data

US 2006/0250875 A1     Nov. 9, 2006

Related U.S. Application Data

(63) Continuation of application No. 10/325,755, filed on Dec. 23, 2002.

(30) Foreign Application Priority Data

Dec. 27, 2001    (JP) .............................. 2001-395682

(51) Int. Cl.
    *G11C 7/06*     (2006.01)
(52) U.S. Cl. ........................... 365/189.07; 365/189.06; 365/191
(58) Field of Classification Search ........... 365/189.07, 365/189.08, 189.06, 191, 230.06
See application file for complete search history.

(56) References Cited

U.S. PATENT DOCUMENTS

| | | | |
|---|---|---|---|
| 5,375,032 A | 12/1994 | Hatakeyama et al. | |
| 5,663,918 A | 9/1997 | Javanifard et al. | |
| RE35,645 E | 10/1997 | Tobita | |
| 5,822,246 A | 10/1998 | Taub et al. | |
| 5,943,263 A | 8/1999 | Roohparvar | |
| 2004/0164343 A1 | 8/2004 | Tokui et al. | |

FOREIGN PATENT DOCUMENTS

| | | |
|---|---|---|
| EP | 0 542 040 | 5/1993 |
| JP | 63-184074 | 7/1988 |
| JP | 5-74136 | 3/1993 |
| JP | 5-143802 | 6/1993 |
| JP | 2000-155140 | 6/2000 |

*Primary Examiner*—Richard T. Elms
*Assistant Examiner*—Hien N Nguyen
(74) *Attorney, Agent, or Firm*—Oblon, Spivak, McClelland, Maier & Neustadt, P.C.

(57) ABSTRACT

A voltage detection circuit control device includes a first voltage detection circuit which detects a first voltage, a second voltage detection circuit which detects a second voltage higher than the first voltage, and an operation signal generating circuit which is connected to the first and second voltage detection circuits and produces a signal for controlling an operation of the first voltage detection circuit on the basis of a voltage detection signal from the second voltage detection circuit.

6 Claims, 5 Drawing Sheets

VOLTAGE DETECTION CIRCUIT CONTROL DEVICE, MEMORY CONTROL DEVICE WITH THE SAME, AND MEMORY CARD WITH THE SAME

CROSS-REFERENCE TO RELATED APPLICATIONS

This application is a continuation of U.S. application No. 10/325,755, filed Dec. 23, 2002, and is based upon and claims the benefit of priority from the prior Japanese Patent application No. 2001-395682, filed Dec. 27, 2001, the entire contents of each of which is incorporated herein by reference.

BACKGROUND OF THE INVENTION

1. Field of the Invention

The present invention relates to a control for disabling and restoring the operation of a voltage detection circuit.

2. Description of the Related Art

In these years, SD (Secure Disk) cards have widely been used more and more as external storage devices that are small in size and excellent in portability and information security. According to physical specifications of the SD card, the operational power supply is defined in two stages. For the purpose of operational compensation, two kinds of power supply voltage detection circuits need to be provided. Normally, since two voltage detection circuits are always activated, operation power is always consumed by the two circuits.

In the conventional memory card such as the SD card, there is no control circuit for disabling either or both of the two voltage detection circuits. Consequently, power is consumed by these circuits even in the standby state in which the memory card is not activated, and the operational efficiency is low.

Jpn. Pat. Appln. KOKAI Publication No. 5-74136 discloses a technique for increasing the life of a cell for a memory card, in order to reduce power consumption of the memory card.

According to the technique of KOKAI 5-74136, cell voltage detection in the memory card is performed only in a short time period in which external power is supplied to the memory card. Specifically, to achieve this, a cell is connected to a switch-operable element, and an output of this element is delivered to a cell voltage detection element. An output of the cell voltage detection element is supplied to a latch circuit, and an output of the latch circuit is delivered to a connector of the memory card.

In this prior art, however, a detected value is held by the latch, and flexible power supply control management of, for example, disabling one of the voltage detection circuits cannot be performed. It is still difficult to enhance the power consumption efficiency.

As has been described above, in the prior art, there is no control circuit for disabling the voltage detection circuit of the memory card. Thus, there is a problem that power is always consumed even in the standby state in which the memory card.

BRIEF SUMMARY OF THE INVENTION

A voltage detection circuit control device according to the present invention comprises: a first voltage detection circuit which detects a first voltage; a second voltage detection circuit which detects a second voltage higher than the first voltage; and an operation signal generating circuit which is connected to the first and second voltage detection circuits and produces a signal for controlling an operation of the first voltage detection circuit on the basis of a voltage detection signal from the second voltage detection circuit.

A memory control device according to the invention comprises: a host interface circuit; a back-end circuit; a first voltage detection circuit which detects a first voltage and produces a drive signal for the host interface circuit; a second voltage detection circuit which detects a second voltage higher than the first voltage and produces a drive signal for the back-end circuit; and an operation signal generating circuit which is connected to the first and second voltage detection circuits and produces a signal for controlling an operation of the first voltage detection circuit on the basis of the back-end circuit drive signal from the second voltage detection circuit.

DETAILED DESCRIPTION OF THE INVENTION

Referring to the accompanying drawings, a detailed description will now be given of a voltage detection circuit control device according to the present invention as well as an SD card that is a non-volatile memory card, to which a memory control device having the voltage detection circuit control device is applied.

Figure 1:
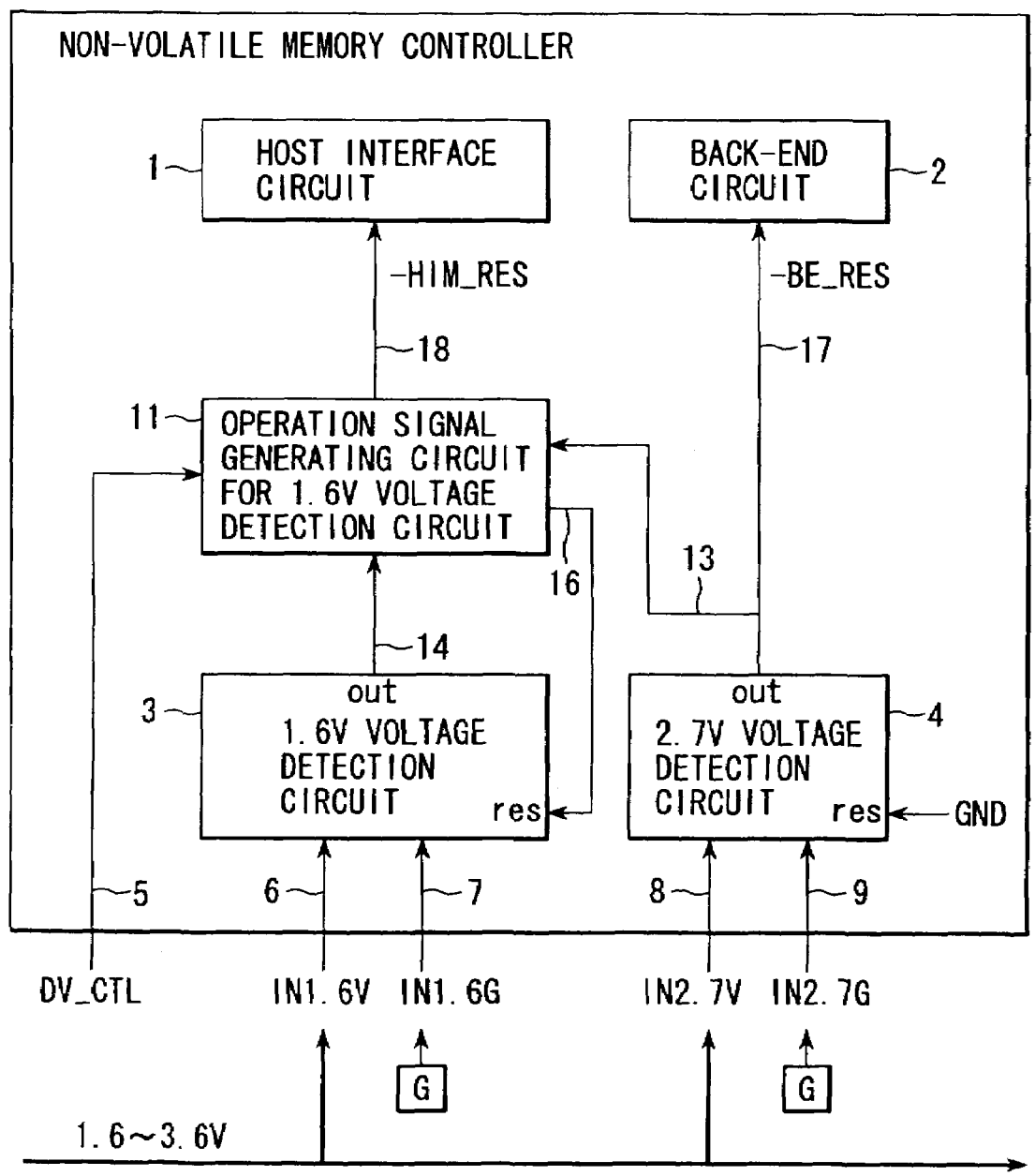
FIG. 1 is a block diagram showing a circuit configuration including a voltage detection circuit according to an embodiment of the present invention.

FIG. 1 is a block diagram showing a circuit configuration including a voltage detection circuit arranged within a non-volatile memory controller provided in an SD card. A host interface circuit 1 controls transmission/reception of signals with a host device to be connected.

Some circuit groups 2, which are referred to as "back-end circuit", are controlled by a microcomputer that is provided in the SD card to control internal operations. Numeral 3 denotes a 1.6V voltage detection circuit that has an enable terminal (res) and detects the presence/absence of supply of 1.6V power from a power line. Numeral 4 denotes a 2.7V voltage detection circuit that has an enable terminal (res) and detects the presence/absence of supply of 2.7V power from the power line.

Numeral 5 designates a selection signal for activating or inactivating a low-power-consumption mode that automatically disables (halts) a low-voltage-side voltage detection circuit, i.e. the 1.6V voltage detection circuit, by an operation according to the present embodiment, as described below.

Numerals 6 and 8 denote power input signal lines to which 1.6V and 3.6V are applied from the power supply voltage line. Numerals 6 and 9 denote ground signal lines (GND).

Numeral 11 denotes an operation signal generating circuit for the 1.6V voltage detection circuit, which generates a disable signal 16 for disabling or enabling the operation of the 1.6V voltage detection circuit 3. The operation signal generating circuit 11 for the 1.6V voltage detection circuit includes a selector for selecting a mode for supplying a detection signal from the 1.6V voltage detection circuit 3 to a reset signal 18 for the host interface circuit 1, or a mode for producing a logic output of the operation signal generating circuit 11 for the 1.6V voltage detection circuit.

A signal line 17 extends from the 2.7V voltage detection circuit 4. Specifically, the signal line 17 is a reset signal (−BE_RES) connected to the back-end circuit 2.

Figure 2:
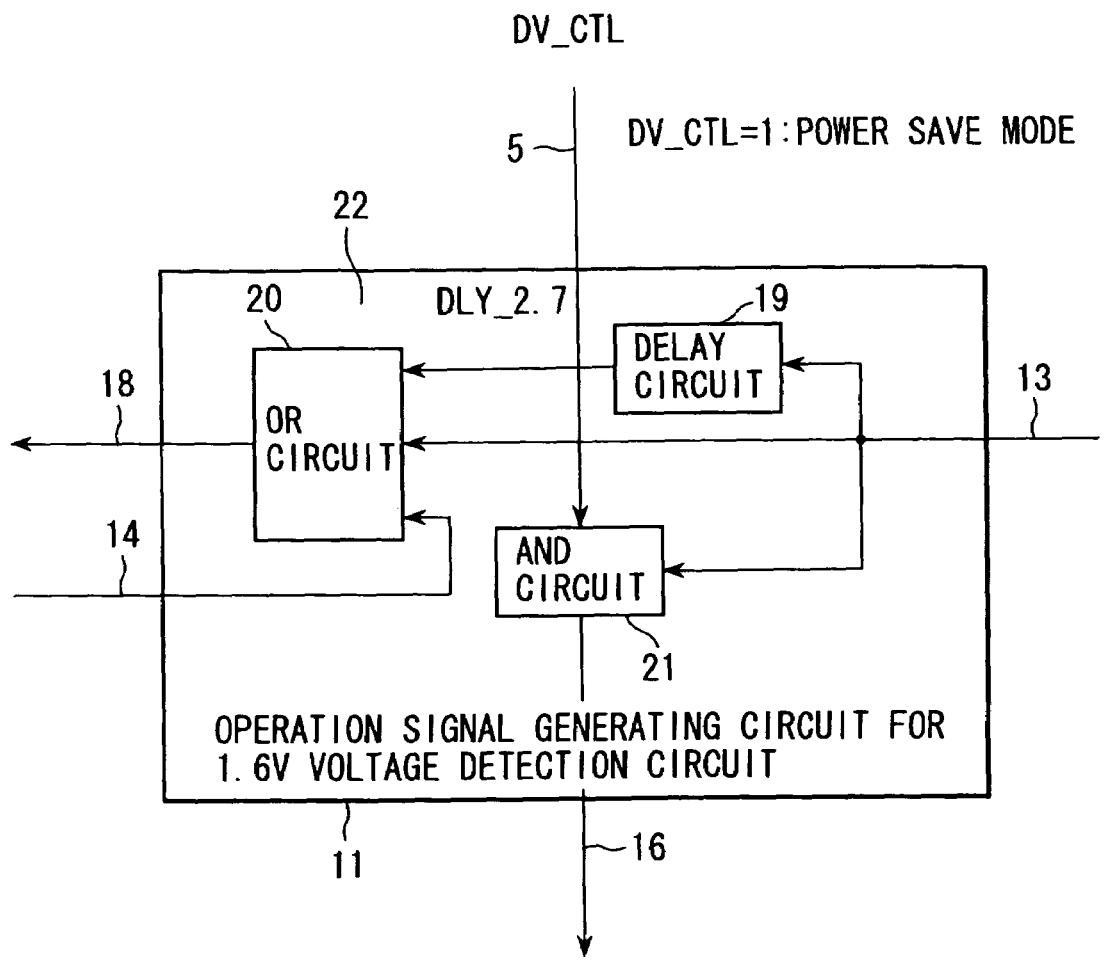
FIG. 2 is a block diagram showing a circuit configuration of an operation signal generating circuit of the voltage detection circuit according to the embodiment of the invention.

Referring now to FIG. 2, a detailed description will now be given of the connections between the operation signal generating circuit 11 for the 1.6V voltage detection circuit and other circuits, that is, connection signal lines and internal circuit configurations. FIG. 2 is a circuit block diagram of the operation signal generating circuit 11 for the 1.6V voltage detection circuit.

In FIG. 2, a line 13 is supplied with an output signal (reset signal) from the 2.7V voltage detection circuit 4, and a line 14 is supplied with an output signal from the 1.6V voltage detection circuit 3.

A reset signal line (−HIM_RES) 18 functions to reset the host interface circuit 1 when the operation mode of the present embodiment has been rendered effective. A signal line 16 supplies a control signal for disabling or enabling the operation of the 1.6V voltage detection circuit 3.

A delay element 19 delays the output signal (reset signal) 13 from the 2.7V voltage detection circuit 4. Numeral 20 denotes an OR circuit, and numeral 21 denotes an AND circuit.

Numeral 22 denotes a delay signal line that delivers a signal obtained by delaying the output signal (reset signal) 13 from the 2.7V voltage detection circuit 4 by a delay element 19.

A control sequence of the 1.6V voltage detection circuit 3 according to the present embodiment as described with reference to FIGS. 1 and 2 will now be described with reference to a control sequence chart of FIG. 3 and a flow chart of FIG. 4.

Figure 3:
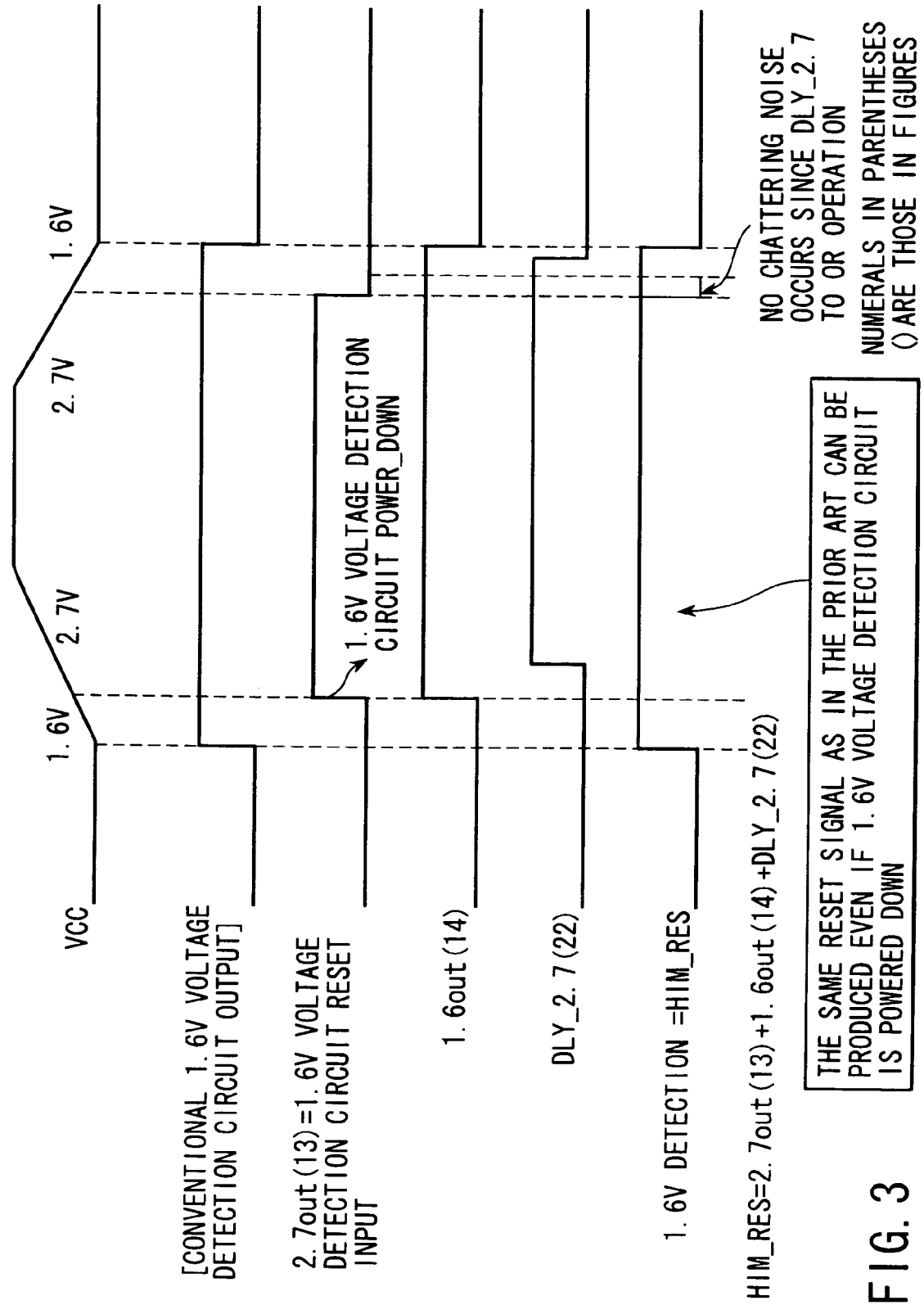
FIG. 3 is a view for explaining a power-down/restoration sequence of the voltage detection circuit according to the embodiment of the invention.

In FIG. 3, as indicated by [Prior-art 1.6V Voltage Detection Circuit Output], in the prior art, when the power supply voltage from the power supply line rises and reaches 1.6V, the 1.6V voltage detection circuit 3 detects a 1.6V voltage and sets an output to the output signal line 14 of the 1.6V voltage detection circuit at "H" level (i.e. release of reset). Thereby, the circuit component connected to the −HIM_RES signal line 18, which is in turn connected to the host interface circuit 1, begins to operate.

If the voltage further rises and reaches 2.7V, the 2.7V voltage detection circuit 4 detects a 2.7V voltage and switches an output to the 2.7V voltage detection circuit output signal line 17 from "L" to "H" (release of reset). At this time point, the circuit connected to the −BE_RES signal line 17, which is in turn connected to the back-end circuit 2, begins to operate.

Normally, when both reset states are released as mentioned above, the system is in operation. When the power is turned off, a sequence reverse to the above is performed. When the supply voltage lowers from 3.6V to 2.7V, the −BE_RES signal line 17 connected to the back-end circuit 2 changes from "H" to "L" and the 2.7V voltage detection circuit 4 operates. The circuit connected to the back-end circuit 2 is reset. When the supply voltage further lowers to 1.6V, the −HIM_RES signal line 18 connected to the host interface circuit 1 changes from "L" to "H", and the 1.6V voltage detection circuit 3 operates. In addition, the circuit connected to the host interface circuit 1 is reset.

The control operation of the 1.6V voltage detection circuit according to the present embodiment will now be described.

A DV_CTL signal line 5 is fixed at "H" on the outside of the chip.

When power is turned on and the supply voltage from the power supply line has reached 1.6V, the output signal 14 from the 1.6V voltage detection circuit 3 changes from "L" to "H". When the supply voltage from the power supply line rises and reaches 2.7V, output signals 13 and 17 from the 2.7V voltage detection circuit 4 change from "L" to "H".

The AND circuit 21 shown in FIG. 2 passes the output signal 13 from the 2.7V voltage detection circuit 4 to the line 16, thus setting the reset input (res input) of the 1.6V voltage detection circuit 3 at "H". Thereby, power-down of the 1.6V voltage detection circuit 3 is effected, and the power consumed up to now is saved.

As regards the −HIM_RES signal 18 delivered to the host interface circuit 1, the 1.6V out signal (detection signal) 14 from the 1.6V voltage detection circuit 3 is made effective by the OR circuit 20 within the operation signal generating circuit 11 for the 1.6V voltage detection circuit, until the 1.6V voltage detection circuit 3 powers down. While the 1.6V voltage detection circuit 3 powers down, the 2.7V out signal (detection signal) 13 from the 2.7V voltage detection circuit 4 is made effective. After the 2.7V out signal (detection signal) 13 from the 2.7V voltage detection circuit 4 has reached "H" level, the 1.6V voltage detection circuit 3 powers down. Thus, a chattering noise does not occur by the OR operation for the 2.7V out signal and 1.6V out signal.

Next, the transition state from the operative state to the power-off state will now be described.

When the voltage from the power line lowers to 2.7V, the 2.7V voltage detection circuit 4 changes its output signal (detection signal) 13 from "H" to "L". Then, the 1.6V voltage detection circuit 3 enters the restoration operation. However, since some delay occurs until the restoration, the signal 22 obtained by delaying the 2.7V out signal (output signal) 13 from the 2.7V voltage detection circuit 4 by the delay element 19 is subjected to the OR operation in the OR circuit 20. Accordingly, no chattering noise occurs, and the −HIM_RES signal (reset signal) 18 to the host interface circuit 1 can be produced.

The −HIM_RES signal 18 to the host interface circuit 1 can be produced by 2.7 out+1.6 out+DLY 2.7 (in this context, sign "+" indicates a logic operation "OR").

The above operations will now be described in succession referring to the flow charts of FIGS. 4 and 5.

Figures 4, 5:
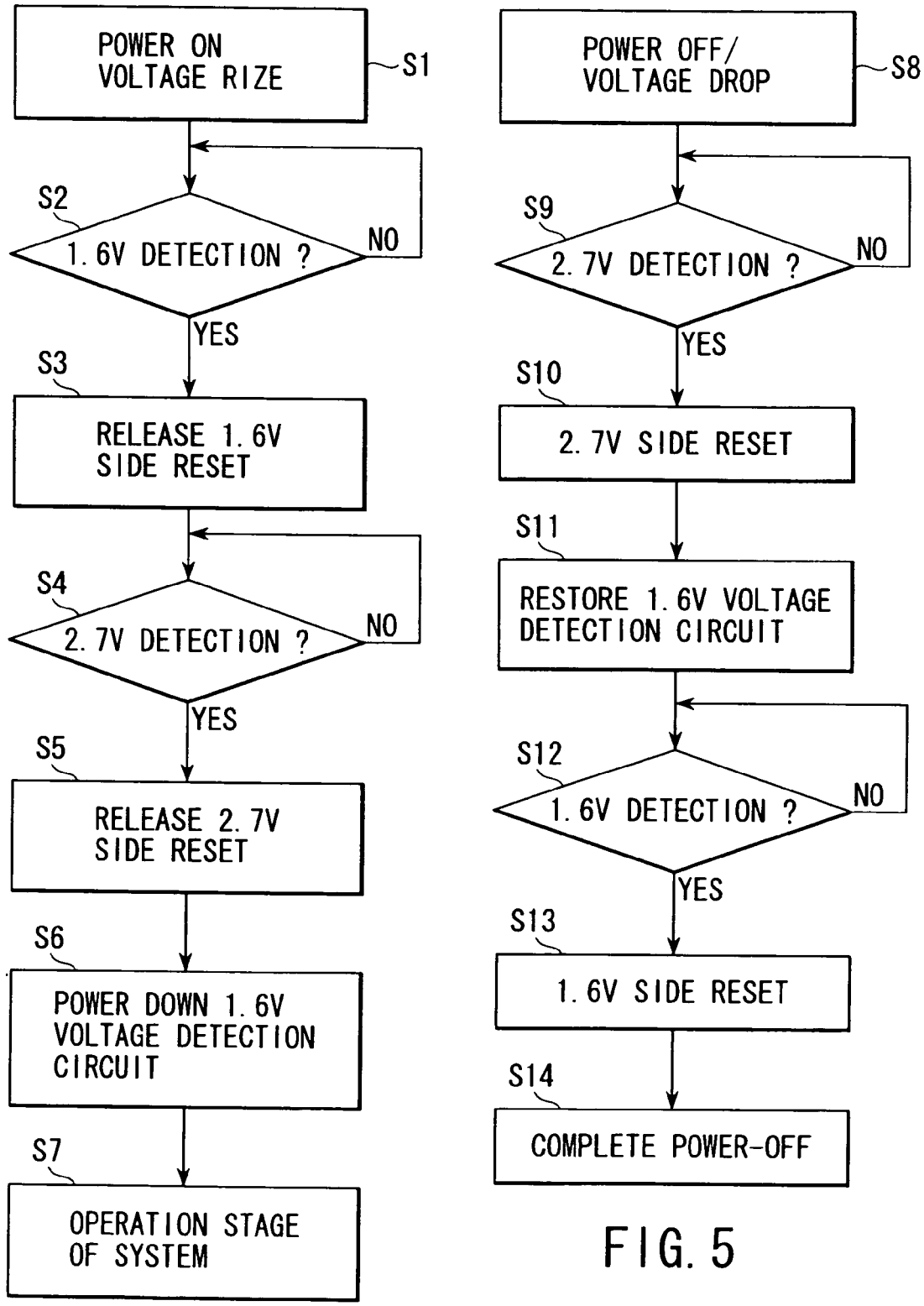
FIG. 4 is a flow chart for explaining a power-down process for the voltage detection circuit according to the embodiment of the invention.
FIG. 5 is a flow chart for explaining a power-restoration process for the voltage detection circuit according to the embodiment of the invention.

FIG. 4 is a flow chart illustrating the power-down operation of the 1.6V voltage detection circuit 3. Upon power-on, the voltage supplied from the power supply line rises (step S1). The 1.6V voltage detection circuit 3 detects whether the supply voltage from the power supply line has reached 1.6V (step S2). This operation is repeated until the supply voltage reaches 1.6V (NO in step S2). If it is detected that the supply voltage has reached 1.6V (YES in step S4), resetting of the host interface circuit 1 on the 1.6V side is released (step S3).

The supply voltage is continuously monitored. The 2.7V voltage detection circuit 4 detects whether the supply voltage from the power supply line has reached 2.7V (step S4). This operation is repeated until the supply voltage reaches 2.7V (NO in step S4). If it is detected that the supply voltage has reached 2.7V (YES in step S4), resetting of the back-end circuit 2 on the 2.7V side is released (step S5).

At the same time, the operation signal generating circuit 11 for the 1.6V voltage detection circuit receives the output signal 13 from the 2.7V voltage detection circuit 4, and the reset signal 16 resets the 1.6V voltage detection circuit 3 (step S6). In this state, the system is in operation (step S7) and the power consumed by the 1.6V voltage detection circuit 3 can be saved.

Referring to the flow chart of FIG. 5, the power restoration operation for the 1.6V voltage detection circuit 3 will now be described. Upon power-off, the voltage supplied from the power supply line decreases (step S8). The 2.7V voltage detection circuit 4 detects whether the supply voltage from the power supply line has reached 2.7V (step S9). This operation is repeated until the supply voltage reaches 2.7V (NO in step S9). If it is detected that the supply voltage has reached 2.7V (YES in step S9), resetting of the back-end circuit 2 on the 2.7V side is executed (step S10). At the same time, the operation signal generating circuit 11 for the 1.6V voltage detection circuit receives the output signal 13 from the 2.7V voltage detection circuit 4, and the restoration signal 16 releases the reset state of the 1.6V voltage detection circuit 3. Thus, the 1.6V voltage detection circuit 3 is set in the restored state. In short, release of the power-down state of the 1.6V voltage detection circuit 3 is executed (step S11).

The supply voltage is continuously monitored, and 1.6V voltage detection circuit 3 detects whether the supply voltage from the power supply line has reached 1.6V (step S12). This operation is repeated until the supply voltage reaches 1.6V (NO in step S12). If it is detected that the supply voltage has reached 1.6V (YES in step S12), resetting of the host interface circuit 1 on the 1.6V side is executed (step S13). In this state, the operation of the system is finished, and the power-off is completed (step S14).

A modification of the present embodiment of the invention will now be described.

Figure 6:
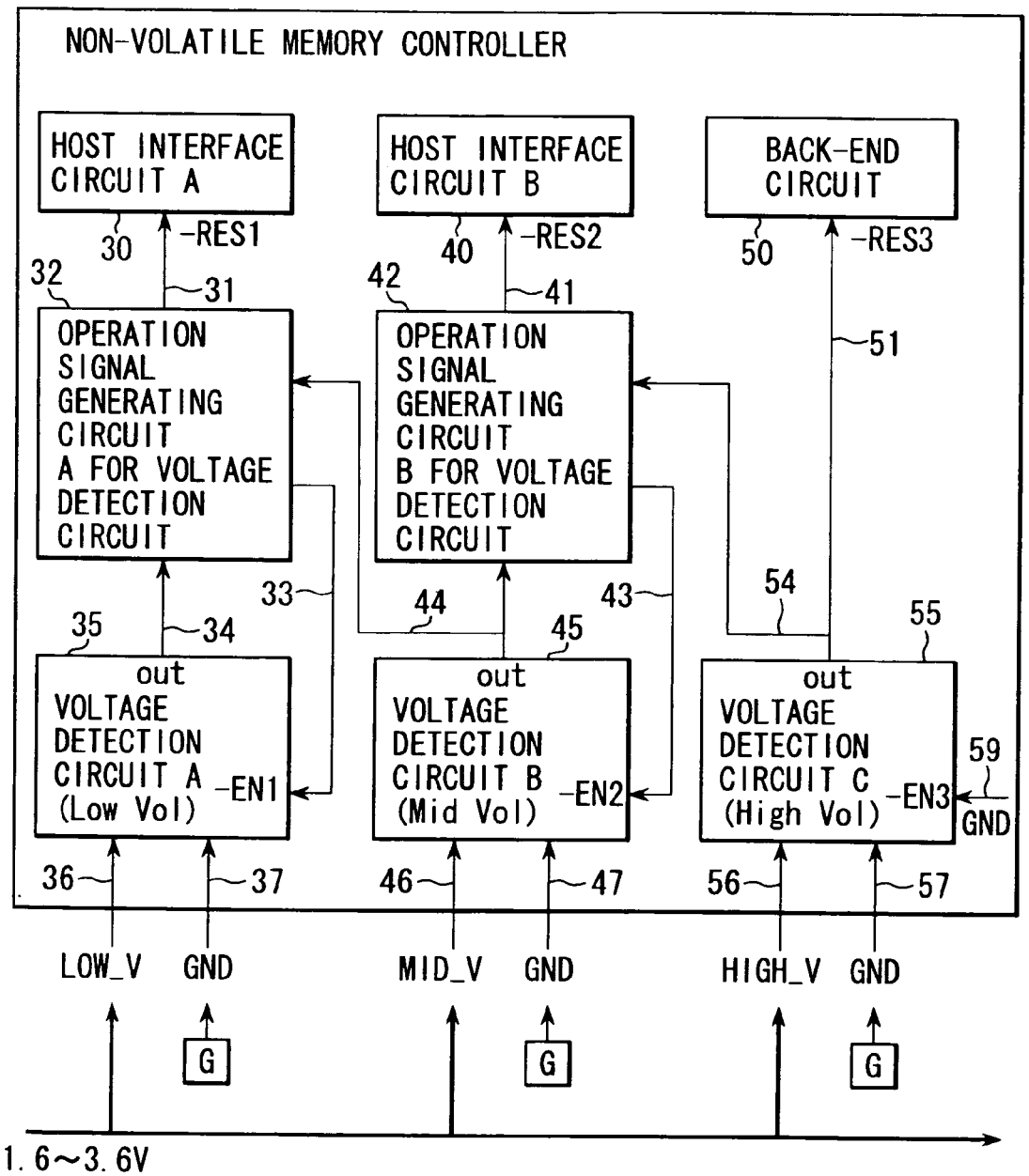
FIG. 6 is a block diagram showing a circuit configuration including a voltage detection circuit according to a modification of the embodiment of the invention.

FIG. 6 shows a simplified structure of the structure shown in FIG. 2, which includes a plurality of voltage detection circuits and a plurality of operation signal generating circuits for the voltage detection circuits.

The operation of this modification is the same as that of the above-described embodiment. In this modification, three voltages are detected. Even if four or more voltage detection circuits are connected, the operation will remain the same.

When power has been turned on, while the supply voltage from the power supply line is being increased from 0V to 3.6V, the voltage detection is effected in the following order: voltage detection circuit A (LOW V: low voltage detection) 35→voltage detection circuit B (MID_V: middle voltage detection) 45→voltage detection circuit C (HIGH_V: high voltage detection) 55. Reset signals are released in succession in the following order: signal line 34→signal line 44→signal line 54.

When power is turned off, the voltage detection is effected in the following order: voltage detection circuit C (HIGH_V: high voltage detection) 55→voltage detection circuit B (MID_V: middle voltage detection) 45→voltage detection circuit A (LOW_V: low voltage detection) 35. Reset signals are set in the LOW state in succession in the following order: signal line 54→signal line 44→signal line 34. In this case, the timing of disabling the voltage detection circuit that is one rank below is the same as the timing shown in FIG. 3 according to the above-described embodiment. Specifically, when the detection voltage of the voltage detection circuit C (HIGH_V: high voltage detection) 55 has been reached, the output signal 43 of operation signal generating circuit 42 of voltage detection circuit B enables (power-down/restoration) the voltage detection circuit B (MID_V: middle voltage detection) 45. Further, when the detection voltage of the voltage detection circuit B (MID_V: middle voltage detection) 45 has been reached, the output signal 33 of operation signal generating circuit 32 of voltage detection circuit A enables the voltage detection circuit A (LOW_V: low voltage detection) 35.

According to the above-described embodiment, the voltage detection circuits (i.e. voltage detection circuit B (MID_V: middle voltage detection) 45 and voltage detection circuit A (LOW_V: low voltage detection) 35), other than the voltage detection circuit C (HIGH_V: high voltage detection) 55, can be powered down to the normal operation state, i.e. a higher voltage state than the detection voltage of the voltage detection circuit C (HIGH_V: high voltage detection) 55.

In the present invention, the structure and operation of the SD memory card have been described. Needless to say, this invention can be applied to other devices with a plurality of voltage detection circuits, with the same operational advantages as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage detection circuit control device for a memory having a host interface circuit, comprising:
   a first voltage detection circuit which detects a first voltage;
   a second voltage detection circuit which detects a second voltage higher than the first voltage; and
   an operation signal generating circuit which is connected to the first and second voltage detection circuits and the host interface circuit of the memory, which produces a signal to make the first voltage detection circuit power down on a basis of a voltage detection signal from the second voltage detection circuit, and which makes the host interface circuit active based on the second voltage detection signal from the second voltage detection circuit before the first voltage detection circuit is powered down.

2. A voltage detection circuit control device according to claim 1, wherein the operation signal generating circuit comprises:
   a delay circuit which delays the detection signal from the second voltage detection circuit;
   an OR circuit which produces a signal corresponding to a detection signal of the first voltage detection circuit, on a basis of an output signal of the delay circuit, the detection signal from the first voltage detection circuit and the detection signal from the second voltage detection circuit; and
   an AND circuit which produces the signal for disabling/enabling operation of the first voltage circuit on a basis of the detection signal from the second voltage detection circuit and an external signal for activating a low-power-consumption mode of the first voltage detection circuit.

3. A voltage detection circuit control device according to claim 1, comprising a plurality of first voltage detection circuits, second voltage detection circuits and operational signal generating circuits.

4. A memory control device comprising:
   a host interface circuit;
   a back-end circuit;
   a first voltage detection circuit which detects a first voltage and produces a drive signal for the host interface circuit;
   a second voltage detection circuit which detects a second voltage higher than the first voltage and produces a drive signal for the back-end circuit; and
   an operation signal generating circuit which is connected to the first and second voltage detection circuits and produces a signal to make the first voltage detection circuit power down on a basis of the drive signal from the second voltage detection circuit.

5. A memory control device according to claim 4, wherein the operation signal generating circuit comprises:
   a delay circuit which delays the drive signal for the back-end circuit from the second voltage detection circuit;
   an OR circuit which produces an operation signal for the host interface circuit, on a basis of an output signal of the delay circuit, a detection signal from the first voltage detection circuit and the drive signal from the second voltage detection circuit; and
   an AND circuit which produces the signal for disabling/enabling the operation of the first voltage circuit on a basis of the drive signal from the second voltage detection circuit and an external signal for activating a low-power-consumption mode of the first voltage detection circuit.

6. A memory control device according to claim 4, comprising a plurality of first voltage detection circuits, second voltage detection circuits and operational signal generating circuits.

* * * * *